US012574007B2

(12) United States Patent
    Daimon

(10) Patent No.:  US 12,574,007 B2
(45) Date of Patent:      Mar. 10, 2026

(54) ELASTIC WAVE DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 895 days.

(21) Appl. No.: 17/835,064

(22) Filed: Jun. 8, 2022

(65) Prior Publication Data

US 2022/0302897 A1      Sep. 22, 2022

Related U.S. Application Data

(63) Continuation of application No. PCT/JP2020/045845, filed on Dec. 9, 2020.

(30) Foreign Application Priority Data

Dec. 19, 2019      (JP) ................................. 2019-229477

(51) Int. Cl.
    *H03H 9/25*          (2006.01)
    *H03H 9/02*          (2006.01)
    *H03H 9/145*         (2006.01)
(52) U.S. Cl.
    CPC .......... *H03H 9/25* (2013.01); *H03H 9/02559* (2013.01); *H03H 9/02866* (2013.01); *H03H 9/145* (2013.01)
(58) Field of Classification Search
    CPC .. H03H 9/25; H03H 9/02559; H03H 9/02866; H03H 9/145; H03H 9/02574; H03H 9/14541
    See application file for complete search history.

(56) References Cited

U.S. PATENT DOCUMENTS 9,621,128 B2 *    4/2017    Iwamoto .................. H03H 9/25
2011/0215883 A1   9/2011    Fujiwara et al.
                            (Continued)

FOREIGN PATENT DOCUMENTS

CN      104380601 A      2/2015
JP      11163668 A       6/1999
                (Continued)

OTHER PUBLICATIONS

JP 2006246050 English Translation (Year: 2025).*
                (Continued)

*Primary Examiner* — Dominick L Plakkoottam
(74) *Attorney, Agent, or Firm* — Keating & Bennett, LLP

(57)          ABSTRACT

An elastic wave device includes a support substrate, a piezoelectric film directly or indirectly provided on the support substrate, and an IDT electrode on the piezoelectric film. The piezoelectric film includes a first piezoelectric film in which a surface facing the support substrate is a plus surface and a surface facing the IDT electrode is a minus surface, and a second piezoelectric film in which a surface facing the support substrate is a minus surface and a surface facing the IDT electrode is a plus surface, the second piezoelectric film being disposed on the first piezoelectric film. A total of the thickness of the first piezoelectric film and the thickness of the second piezoelectric film is about 1λ or less where λ represents a wavelength determined by an electrode finger pitch of the IDT electrode.

20 Claims, 7 Drawing Sheets

(56) References Cited

U.S. PATENT DOCUMENTS

| | | | |
|---|---|---|---|
| 2012/0198672 A1 | 8/2012 | Ueda et al. | |
| 2012/0306593 A1* | 12/2012 | Kidoh | H03H 9/0576 333/186 |
| 2013/0026881 A1* | 1/2013 | Okamoto | H03H 9/0222 310/313 C |
| 2013/0271238 A1* | 10/2013 | Onda | H03H 9/0576 333/195 |
| 2013/0285768 A1* | 10/2013 | Watanabe | H10N 30/01 333/193 |
| 2015/0102705 A1 | 4/2015 | Iwamoto et al. | |
| 2016/0294361 A1* | 10/2016 | Yamane | H03H 9/14594 |
| 2018/0102761 A1* | 4/2018 | Takai | H03H 9/14544 |
| 2018/0188214 A1* | 7/2018 | Oono | H10N 30/50 |
| 2018/0301616 A1* | 10/2018 | Kimura | H03H 9/14541 |
| 2019/0068155 A1* | 2/2019 | Kimura | H03H 3/02 |
| 2019/0097602 A1* | 3/2019 | Kimura | H03H 9/02228 |
| 2019/0245510 A1* | 8/2019 | Mimura | H10N 30/06 |
| 2020/0083859 A1* | 3/2020 | Watanabe | H03H 9/02834 |

FOREIGN PATENT DOCUMENTS

| | | | | | |
|---|---|---|---|---|---|
| JP | 2003198322 A | | 7/2003 | | |
| JP | 2003209457 A | | 7/2003 | | |
| JP | 2006246050 A | * | 9/2006 | | |
| JP | 2011182220 A | | 9/2011 | | |
| JP | 2012165132 A | | 8/2012 | | |
| KR | 20010029007 A | * | 4/2001 | | |
| WO | 2012086639 A1 | | 6/2012 | | |
| WO | 2013031651 A1 | | 3/2013 | | |
| WO | 2017013968 A1 | | 1/2017 | | |
| WO | WO-2018146883 A1 | * | 8/2018 | | H03H 9/02574 |

OTHER PUBLICATIONS

WO-2018146883-A1 (Includes original doc)—English Translation (Year: 2025).*

KR-20010029007-A (Includes original doc)—English Translation (Year: 2025).*

International Search Report in PCT/JP2020/045845, mailed Feb. 16, 2021, 4 pages.

International Written Opinion in PCT/JP2020/045845, mailed Feb. 16, 2021, 4 pages.

Official Communication issued in corresponding Chinese Patent Application No. 202080084520.9, mailed on Sep. 27, 2025, 6 pages.

* cited by examiner

RATIO OF THICKNESS OF FIRST LiNbO$_3$ FILM TO TOTAL
THICKNESS OF FIRST AND SECOND LiNbO$_3$ FILMS (%)

ELASTIC WAVE DEVICE

CROSS REFERENCE TO RELATED APPLICATIONS

This application claims the benefit of priority to Japanese Patent Application No. 2019-229477 filed on Dec. 19, 2019 and is a Continuation Applications of PCT Application No. PCT/JP2020/045845 filed on Dec. 9, 2020. The entire contents of each application are hereby incorporated herein by reference.

BACKGROUND OF THE INVENTION

1. Field of the Invention

The present invention relates to an elastic wave device that includes a piezoelectric film.

2. Description of the Related Art

Various elastic wave devices that include piezoelectric films have been proposed. For example, in an elastic wave device described in WO2012/086639 below, a high acoustic velocity member, a low acoustic velocity film, and a piezoelectric film are stacked in this order on a support substrate. An IDT electrode is disposed on the piezoelectric film.

When a band pass filter is formed by using an elastic wave device such as the one described in WO2012/086639, higher-order mode spurious responses sometimes appear in frequency ranges outside the passband.

SUMMARY OF THE INVENTION

Preferred embodiments of the present invention provide elastic wave devices that are each able to reduce or prevent higher-order mode spurious responses.

An elastic wave device according to a preferred embodiment of the present invention includes a support substrate, a piezoelectric film directly or indirectly stacked on the support substrate, and an IDT electrode on the piezoelectric film. The piezoelectric film includes a first piezoelectric film in which a surface facing the support substrate is a plus surface and a surface facing the IDT electrode is a minus surface, and a second piezoelectric film in which a surface facing the support substrate is a minus surface and a surface facing the IDT electrode is a plus surface, the second piezoelectric film being located on the first piezoelectric film. A total of a thickness of the first piezoelectric film and a thickness of the second piezoelectric film is about $1\lambda$ or less, where $\lambda$ represents a wavelength determined by an electrode finger pitch of the IDT electrode.

According to preferred embodiments of the present invention, higher-order mode spurious responses outside the passband are able to be reduced or prevented when the elastic wave device is used in a filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified by describing specific preferred embodiments of the present invention with reference to the drawings.

The preferred embodiments described in this description are only exemplary, and features can be partially substituted or combined among different preferred embodiments.

Figure 1A:
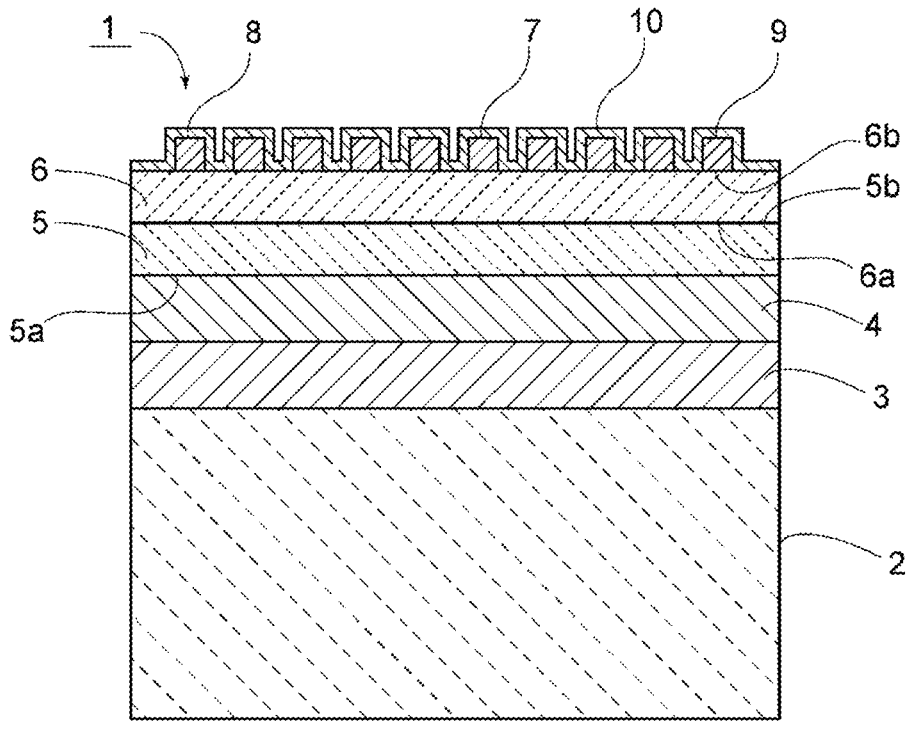
FIG. 1A is a front cross-sectional view of an elastic wave device according to a first preferred embodiment of the present invention.
Figure 1B:
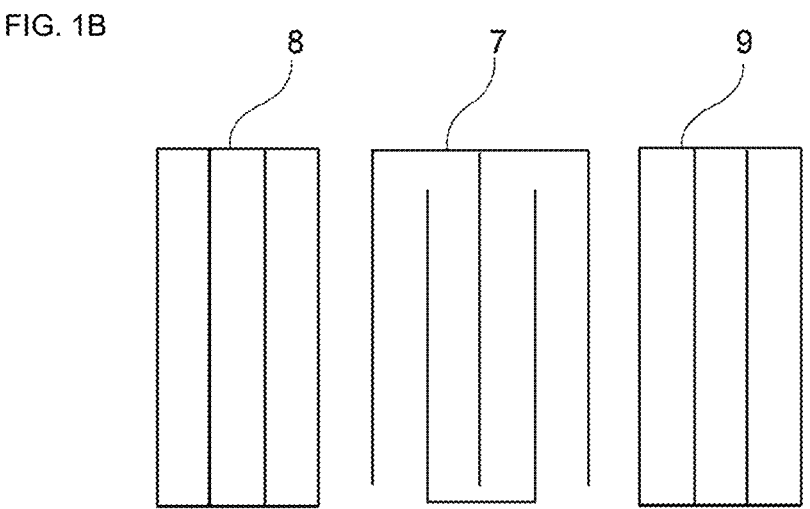
FIG. 1B is a schematic plan view of an electrode structure of the elastic wave device according to a first preferred embodiment of the present invention.

FIG. 1A is a front cross-sectional view of an elastic wave device according to a first preferred embodiment of the present invention, and FIG. 1B is a schematic plan view of an electrode structure thereof.

An elastic wave device 1 includes a support substrate 2. In the present preferred embodiment, the support substrate 2 is made of Si, for example. However, the material for the support substrate 2 is not particularly limited. In addition to Si, for example, quartz crystal, semiconductors, and insulators such as alumina and silicon nitride can also be used. Alternatively, for example, Si including a (111) surface, Si having a (110) surface, or quartz crystal is used.

A high acoustic velocity material layer 3 and a low acoustic velocity film 4 are stacked on the support substrate 2.

A first LiTaO₃ film 5 defining and functioning as a first piezoelectric film and a second LiTaO₃ film 6 defining and functioning as a second piezoelectric film are stacked on the low acoustic velocity film 4. In the present preferred embodiment, a piezoelectric film includes a multilayer body that includes first and second LiTaO₃ films 5 and 6. In addition, the piezoelectric film includes first and second LiTaO₃ films 5 and 6 is indirectly stacked on the support substrate 2. An IDT electrode 7 and reflectors 8 and 9 are disposed on the second LiTaO₃ film. A dielectric film 10 is stacked so as to cover the IDT electrode 7 and the reflectors 8 and 9. The IDT electrode 7 is made of an appropriate metal or alloy. Preferably, the main electrode layer is made of, for example, Al or an AlCu alloy.

As described above, in the elastic wave device 1, the piezoelectric film includes first and second LiTaO₃ films 5 and 6. Here, a main surface 5a of the first LiTaO₃ film 5 facing the support substrate 2 is the minus surface, and a main surface 5b on the opposite side from the support substrate 2 is the plus surface. In the second LiTaO₃ film 6, a main surface 6a facing the support substrate 2 is the plus surface, and a main surface 6b facing the IDT electrode 7 is the minus surface. In other words, the first and second LiTaO₃ films 5 and 6 are stacked so that the plus surfaces are in contact with each other.

In preferred embodiments of the present invention, the plus surfaces and the minus surfaces of the first and second piezoelectric films are expressions based on the polarities of the polarization of the first and second piezoelectric films, and, more preferably, the direction of polarization of the first piezoelectric film and the direction of polarization of the second piezoelectric film are opposite to each other.

In order for the first and second LiTaO₃ films 5 and 6 to have the above-described polarities, for example, the crystal orientation of the first LiTaO₃ film 5 may be adjusted to about (0°, 138°, 0°) in terms of Euler angles, and the crystal orientation of the second LiTaO₃ film 6 may be adjusted to about (0°, −42°, 180°) in terms of Euler angles. Here, in the expression of Euler angles (ϕ, θ, ψ), ψ denotes the propagation angle ψ.

The total of the thickness of the first LiTaO₃ film 5 and the thickness of the second LiTaO₃ film 6 is about a or less, for example, where λ represents the wavelength determined by the electrode finger pitch of the IDT electrode 7. As a result, as described below, higher-order mode spurious responses can be effectively reduced or prevented in the resonator characteristics of the elastic wave device 1.

A first example of the elastic wave device 1 described above was prepared by using the following design parameters.

Support substrate 2: Si substrate having a (111) surface with a propagation angle ψ of about 46°;

High acoustic velocity material layer 3: silicon nitride film having a thickness of about 300 nm;

Low acoustic velocity film 4: silicon oxide film having a thickness of about 300 nm;

First LiTaO₃ film 5: about 200 nm in thickness; and

Second LiTaO₃ film 6: about 200 nm in thickness.

The IDT electrode 7 and the reflectors 8 and 9 are defined by a multilayer film that included a Ti layer, an AlCu layer, and a Ti layer disposed in that order from the second LiTaO₃ film 6 side. The thickness was as follows: lower Ti layer=about 12 nm, AlCu layer=about 100 nm, upper Ti layer=about 4 nm.

The wavelength λ determined by the electrode finger pitch of the IDT electrode 7 was set to about 2 μm, and the duty of the IDT electrode 7 was set to about 0.5; and Dielectric film 10: silicon oxide film having a thickness of about 35 nm As described, above, the total of the thickness of the first LiTaO₃ film 5 and the thickness of the second LiTaO₃ film 6 was about 400 nm or about 0.2λ.

The cut angles of the first LiTaO₃ film 5 and the second LiTaO₃ film 6 were both set to about 42° Y-cut. The main surface 5a and the main surface 5b of the first LiTaO₃ film 5 were the minus surface and the plus surface, respectively, and the main surface 6a and the main surface 6b of the second LiTaO₃ film 6 were the plus surface and the minus surface, respectively.

Figure 2:
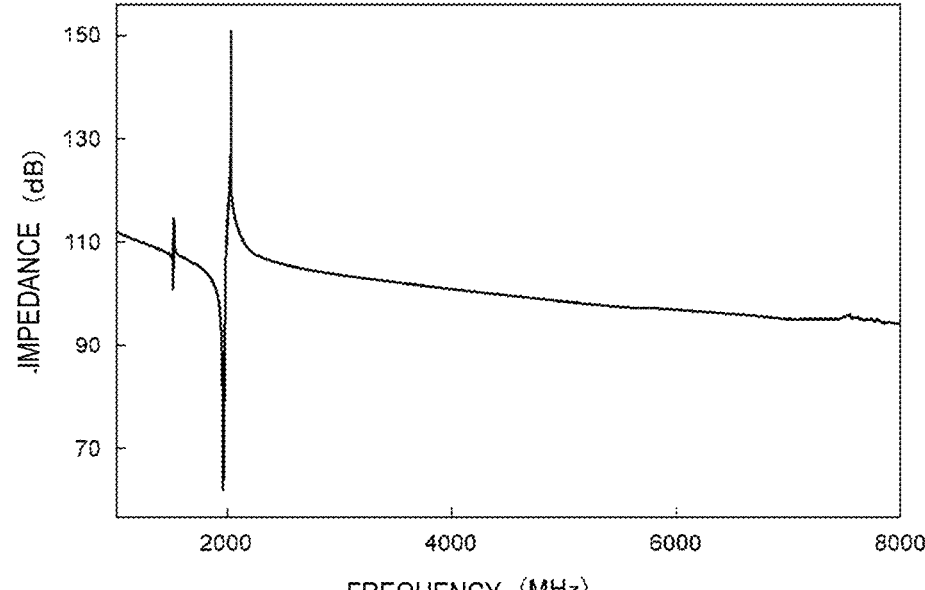
FIG. 2 is a graph indicating an impedance characteristic of an elastic wave device of a first example of a preferred embodiment defining and functioning as a resonator.

The impedance characteristic of the elastic wave device 1 configured as described above is indicated in FIG. 2. As indicated in FIG. 2, a prominent response of the SH mode of shear waves, which is the main mode, appears at around 2000 MHz. Moreover, it can be understood that substantially no higher-order mode spurious response appears in the region higher than the main mode response.

Figure 3:
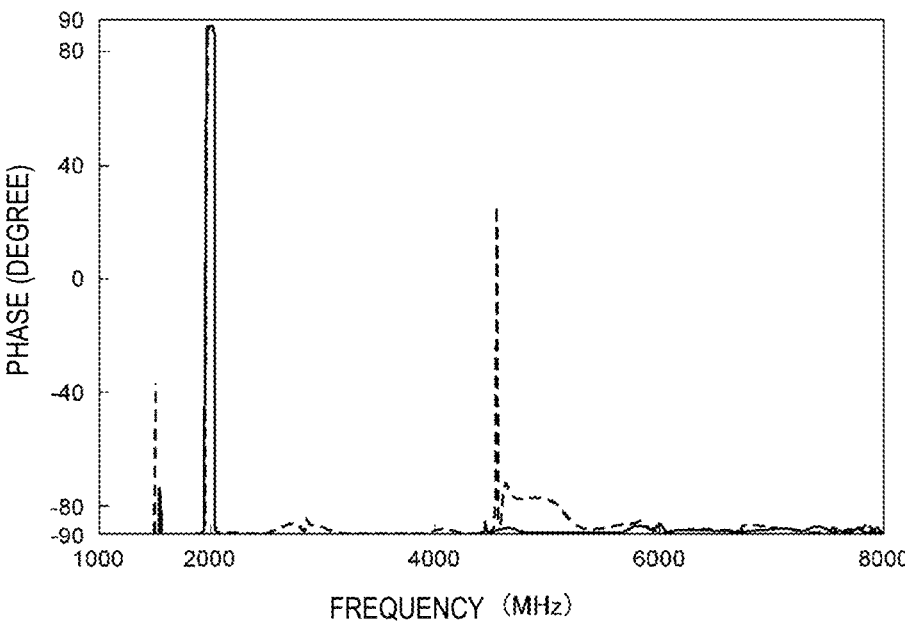
FIG. 3 is a graph indicating phase characteristics of elastic wave devices of a first example according to a preferred embodiment of the present invention and a first comparative example defining and functioning as resonators.

FIG. 3 is a graph indicating phase characteristics of the elastic wave device of the first example of a preferred embodiment of the present invention and an elastic wave device of a first comparative example serving as resonators. The solid line indicates the result of the first example, and the broken line indicates the result of the first comparative example.

The first comparative example was the same or substantially the same as the first example except that, instead of the first LiTaO₃ film 5 and the second LiTaO₃ film 6, a single-layer LiTaO₃ film having a thickness of about 0.2λ was used. Here, a surface of the single-layer LiTaO₃ film facing the support substrate was the minus surface, and a surface facing the IDT electrode was the plus surface.

As shown in FIG. 3, in the first comparative example, a prominent higher-order mode spurious response appears at around 4500 MHz. In contrast, it can be understood that, in the first example, the higher-order mode spurious response at around 4500 MHz is very small.

As apparent from FIG. 3, the main mode response at around 2000 MHz in the first example is comparable to the response obtained in the first comparative example. Thus, according to the elastic wave device 1 of the first example, the main mode response is sufficiently large.

Thus, according to the first example, a higher-order mode spurious response can be effectively reduced or prevented without degrading the main mode response.

The reason why the higher-order mode spurious response was reduced or prevented in the first example as described above is not clear, but is probably that because the first and second LiTaO₃ films 5 and 6 having different polarities are stacked with the plus surfaces in contact with each other, the higher-order modes cancel each other out. Although the plus surfaces were in contact with each other in the first example, first and second LiTaO₃ films 5 and 6 having different polarities may be stacked such that the minus surfaces are in contact with each other. In other words, a first LiTaO$_3$ film 5 defining and functioning as a first piezoelectric film may be stacked on a second LiTaO$_3$ film 6 serving as a second piezoelectric film. Similar effects are obtained in such a case also.

However, preferably, the first and second piezoelectric films are stacked such that the plus surface of the first piezoelectric film is in contact with the plus surface of the second piezoelectric film. In this manner, the adhesion strength between the first and second piezoelectric films can be increased compared to when the minus surfaces are in contact with each other, and thus detachment between the first and second piezoelectric films rarely occurs.

In preferred embodiments of the present invention, the stacking configuration of the first piezoelectric film and the second piezoelectric film may be that a second piezoelectric film is stacked on a first piezoelectric film as described above, or a first piezoelectric film is stacked on a second piezoelectric film.

Since a higher-order mode spurious response can be reduced or prevented in the elastic wave device 1, for example, when multiple elastic wave devices 1 are used to define a band pass filter, the higher-order mode spurious response in the region higher than the passband can be effectively reduced or prevented.

Figure 4:
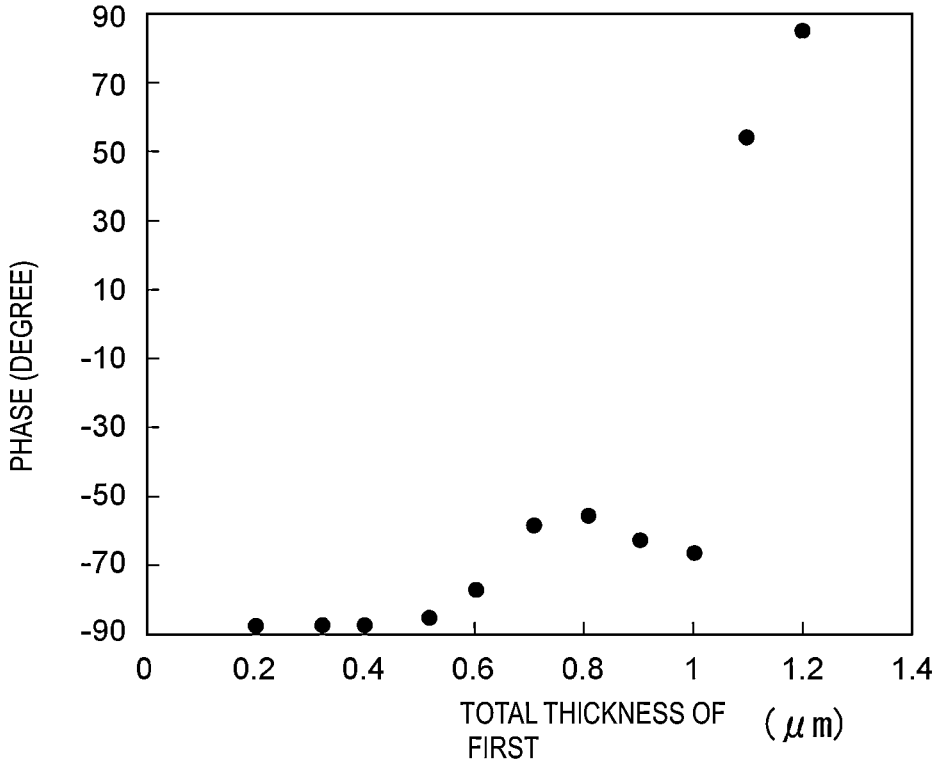
FIG. 4 is a graph indicating the relationship between the total thickness of first and second $LiTaO_3$ films and the maximum value of the phase at a frequency position where a higher-order mode response appears.

Multiple elastic wave devices were prepared by making the thickness of the first LiTaO$_3$ film 5 the same or substantially the same as the thickness of the second LiTaO$_3$ film 6 in the elastic wave device 1 of the first example but varying the total thickness. FIG. 4 indicates the relationship between the total thickness of the first and second LiTaO$_3$ films 5 and 6 in these elastic wave devices and the maximum value of the phase at around 4500 MHz where a higher-order mode response appears. The total thickness was changed in the range of about 0.2 μm or more and about 1.2 μm or less in about 0.1 μm increments.

In other words, the total thickness was set to about 0.2 μm, about 0.3 μm, about 0.4 μm, about 0.5 μm, about 0.6 μm, about 0.7 μm, about 0.8 μm, about 0.9 μm, about 1 μm, about 1.1 μm, and about 1.2 μm.

Figure 5:
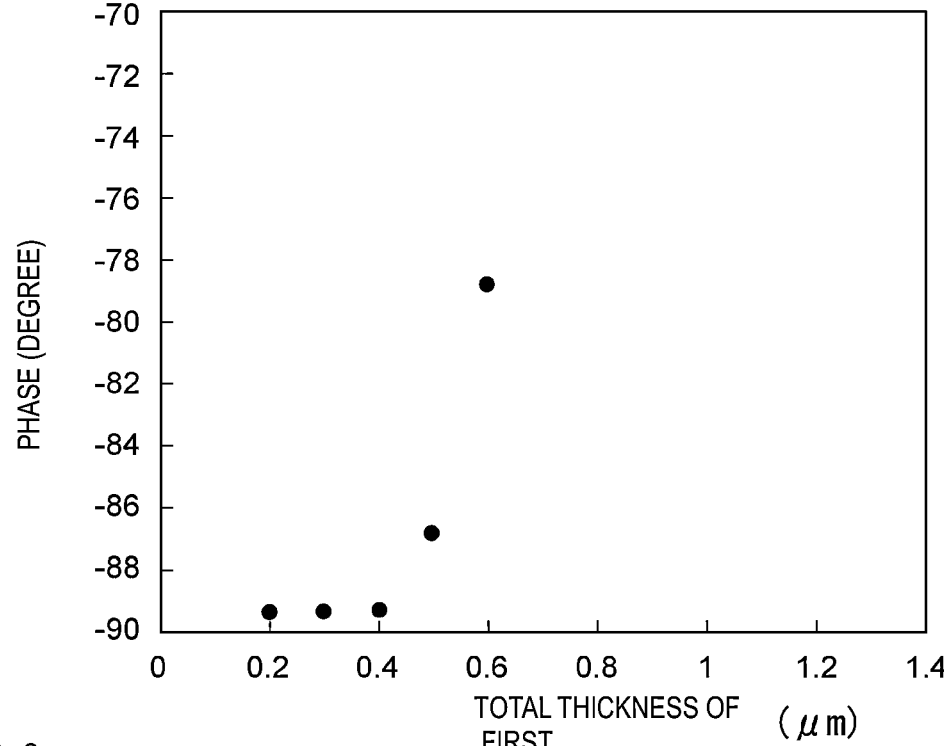
FIG. 5 is a graph magnifying the phase indicated by the vertical axis in FIG. 4.

As apparent from FIG. 4, the higher-order mode phase can be sufficiently decreased as long as the total thickness is about 1 μm based on the wavelength λ of the present preferred embodiment, about 0.5λ) or less. More preferably, as is apparent from a graph in FIG. 5 that magnifies the vertical axis of FIG. 4, spurious responses can be more effectively reduced or prevented as long as the total thickness is about 0.5 μm (based on the wavelength λ of the present preferred embodiment, about 0.25λ) or less. Thus, the total thickness is preferably about 0.5λ or less and more preferably about 0.25λ or less, for example. Even in the case where the value of λ is other than about 2 μm unlike the present preferred embodiment, the higher-order mode phase can be sufficiently minimized by adjusting the total thickness to about 0.5λ or less and more preferably about 0.25λ or less, for example.

As the total thickness of the first and second LiTaO$_3$ films 5 and 6 increases, the acoustic velocity of the higher-order mode decreases, and thus the cutoff of the bulk wave acoustic velocity achieved by the Si support substrate 2 can no longer be used. Thus, presumably, the higher-order mode response is intensified. Thus, as described above, the total thickness is set to about 1 μm=0.5λ or less.

Next, in the structure of the above-described first example, the total thickness of the first and second LiTaO$_3$ films 5 and 6 was fixed at about 0.4 μm=0.2λ, and the thickness of the first LiTaO$_3$ film 5 and the thickness of the second LiTaO$_3$ film 6 were set as indicated in Table 1 below.

TABLE 1

| Thickness of first LiTaO$_3$ film (μm) | Thickness of second LiTaO$_3$ film (μm) |
|---|---|
| 0.05 | 0.35 |
| 0.1 | 0.3 |
| 0.15 | 0.25 |
| 0.2 | 0.2 |
| 0.25 | 0.15 |
| 0.3 | 0.1 |

Figure 6:
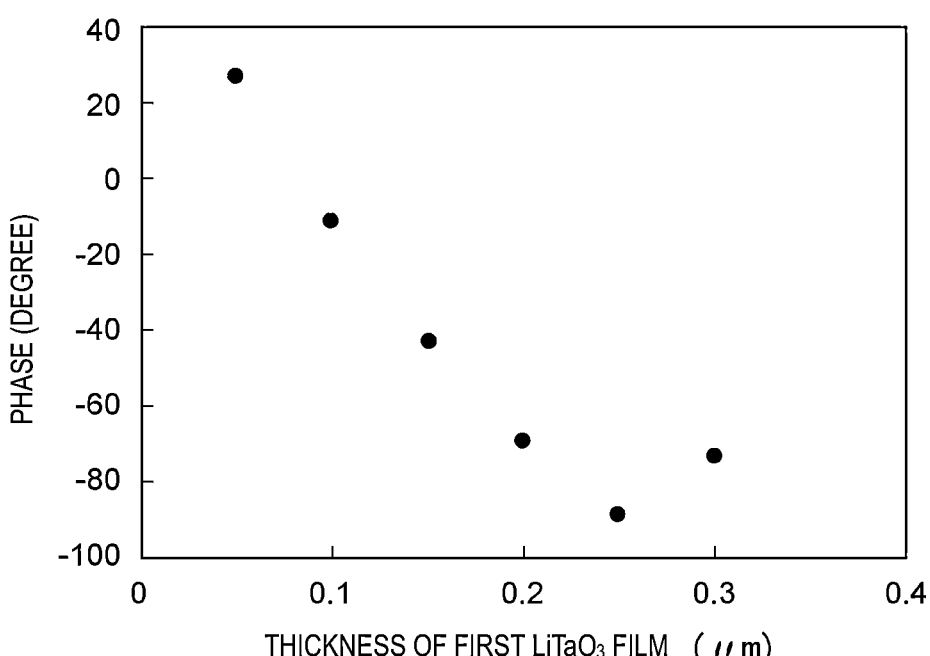
FIG. 6 is a graph indicating the relationship between the maximum value of the phase of the spurious response and the thickness of the first $LiTaO_3$ film changed to about 0.05 μm, about 0.1 μm, about 0.15 μm, about 0.2 μm, about 0.25 μm, and about 0.3 μm while the total thickness of the first and second $LiTaO_3$ films is fixed at about 0.4 μm=$0.2\lambda$.

For the elastic wave device with the aforementioned structure, the maximum value of the phase of the spurious response at around 4500 MHz was determined. FIG. 6 is a graph indicating the relationship between the thickness (μm) of the first LiTaO$_3$ film and the maximum value of the phase of the above-described higher-order mode spurious response.

As is apparent from FIG. 6, when the thickness of the first LiTaO$_3$ film 5 on the lower side (the one closer to the support substrate selected from the first and second LiTaO$_3$ films 5 and 6) is about 0.2 μm or more, that is, when the thickness of the first LiTaO$_3$ film 5 is larger than the thickness of the second LiTaO$_3$ film 6, the higher-order mode can be more effectively reduced or prevented.

Next, in the structure of the first example, the total thickness of the first LiTaO$_3$ film 5 and the second LiTaO$_3$ film 6 was fixed at about 0.4 μm=0.2λ, and the thickness of the first LiTaO$_3$ film 5 was changed to about 0.05 μm, about 0.1 μm, about 0.15 μm, about 0.2 μm, about 0.25 μm, about 0.3 μm, and about 0.35 μm. Y-cut LiTaO$_3$ films having various cut angles were used as the first and second LiTaO$_3$ films 5 and 6. The cut angles of the first LiTaO$_3$ film 5 and the second LiTaO$_3$ film 6 were equal or substantially equal to each other.

Figure 7:
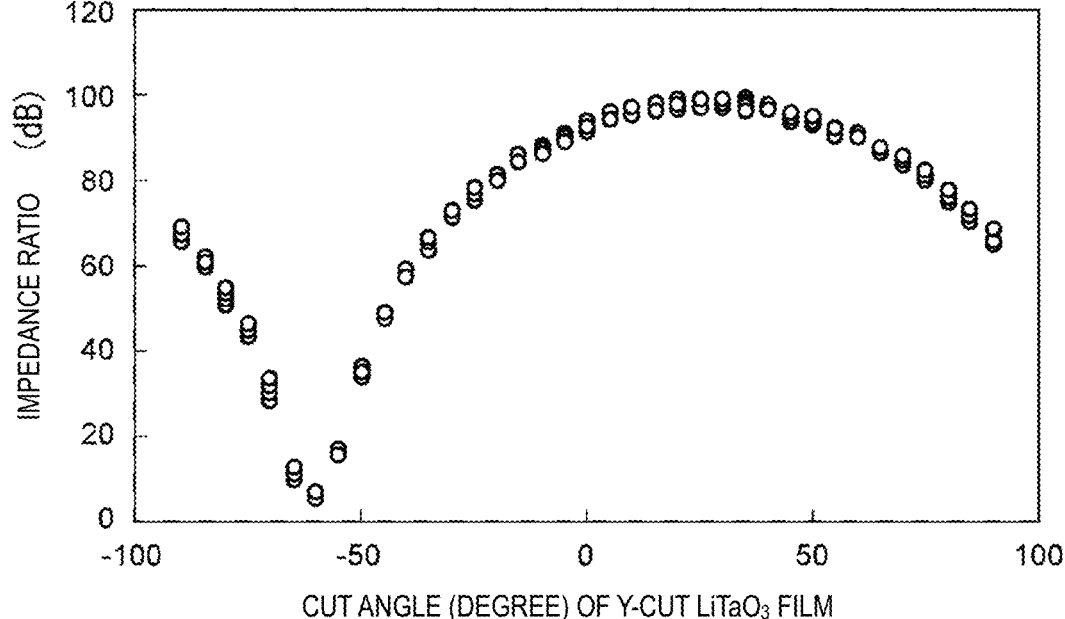
FIG. 7 is a graph indicating the relationship between the impedance ratio in the impedance characteristics and the cut angle of the Y-cut $LiTaO_3$ film of an elastic wave device in which the total thickness of the first and second $LiTaO_3$ films formed of Y-cut $LiTaO_3$ films is fixed at about 0.4 μm=$0.2\lambda$ while the thickness of the first $LiTaO_3$ film is changed to about 0.05 μm, about 0.1 μm, about 0.15 μm, about 0.2 μm, about 0.25 μm, about 0.3 μm, and about 0.35 μm.

FIG. 7 is a graph indicating the relationship between the cut angle of the elastic wave devices configured as described above and the impedance ratio in the impedance characteristics.

Here, the impedance ratio is a ratio of the impedance at an antiresonant frequency to the impedance at the resonant frequency of the main mode. FIG. 7 indicates that the main mode impedance ratio stays the same or substantially the same for the respective cut angles even when the thickness of the first LiTaO$_3$ film 5 is changed in the range of about 0.05 μm or more and about 0.35 μm or less. It can also be understood that as long as the cut angle is about −20° or more and about +75° or less, the main mode impedance ratio can be increased to about 80 dB or more. Thus, preferably, the cut angle of the Y-cut LiTaO$_3$ film is about −20° or more and about +75° or less, for example.

Figure 8:
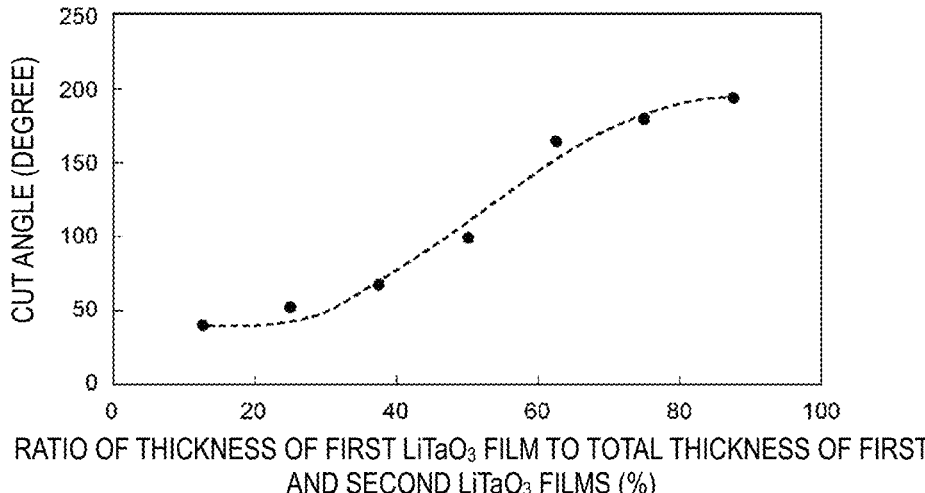
FIG. 8 is a graph indicating the relationship between the $LiTaO_3$ film cut angle that can effectively reduce or prevent the Rayleigh wave spurious response and the ratio of the thickness of the first $LiTaO_3$ film to the total thickness of the first and second $LiTaO_3$ films.

FIG. 8 is a graph indicating the relationship between the cut angle that can reduce or prevent the Rayleigh wave spurious response and the ratio (%) of the thickness of the first LiTaO$_3$ film 5 to the total thickness of the first and second LiTaO$_3$ films 5 and 6 in the first example, the ratio being changed while fixing the total thickness at about 0.4 μm=0.2λ. The broken line in FIG. 8 indicates a formula obtained by approximation of multiple plots in FIG. 8. This formula is formula (1) below.

$$y = -0.0009955556x^3 + 0.1552380952x^2 - 4.6325396825x + 78.5714285714 \qquad \text{formula (1)}$$

Here, y indicates the cut angle, and x indicates the above-described ratio of the thickness of the first LiTaO₃ film 5.

The Rayleigh wave spurious response can be further effectively reduced or prevented as long as the value relative to y obtained in approximation formula (1) is within the range of about (y±10°)+180n (where n represents an integer of 0, 1, 2, 3, . . . ) or in the range of (y±10°)−180n (where n represents an integer of 0, 1, 2, 3, . . . ).

The first and second piezoelectric films of the elastic wave device according to a preferred embodiment of the present invention may be made of LiNbO₃ films. A structure in which first and second LiNbO₃ films are used, instead of the first and second LiTaO₃ films 5 and 6, is described as a second example of a preferred embodiment of the present invention. A second example was prepared by using the following design parameters.

Support substrate: Si substrate having a (111) surface with a propagation angle ψ of about 46°;

High acoustic velocity material layer: silicon nitride film having a thickness of about 300 nm;

Low acoustic velocity film: silicon oxide film having a thickness of about 300 nm;

First LiNbO₃ film: about 200 nm in thickness; and

Second LiNbO₃ film: about 200 nm in thickness.

The IDT electrode and the reflectors were provided by using a multilayer film that included a Ti layer, an AlCu layer, and a Ti layer disposed in that order from the second LiNbO₃ film side. The thickness was as follows: lower Ti layer=about 12 nm, AlCu layer=about 100 nm, upper Ti layer=about 4 nm.

The wavelength λ determined by the electrode finger pitch of the IDT electrode was set to about 2 μm, and the duty of the IDT electrode was set to about 0.5; and Dielectric film: silicon oxide film having a thickness of about 30 nm.

As described above, the total of the thickness of the first LiNbO₃ film and the thickness of the second LiNbO₃ film was about 400 nm or about 0.2λ, for example.

In addition, the cut angles of the first LiNbO₃ film and the second LiNbO₃ film were both set to about 30° Y-cut. In the first LiNbO₃ film, a main surface facing the support substrate is the plus surface and another main surface facing the second LiNbO₃ film is the minus surface, and, in the second LiNbO₃ film, a main surface facing the first LiNbO₃ film is the minus surface, and another main surface facing the IDT electrode is the plus surface.

For comparison, an elastic wave device of a second comparative example was prepared as with the second example described above, except that a single-layer 30° Y-cut LiNbO₃ film having a thickness of about 400 nm was used. In the single-layer LiNbO₃ film of the second comparative example, a surface facing the support substrate was the minus surface and a main surface facing the IDT electrode was the plus surface.

Figure 9:
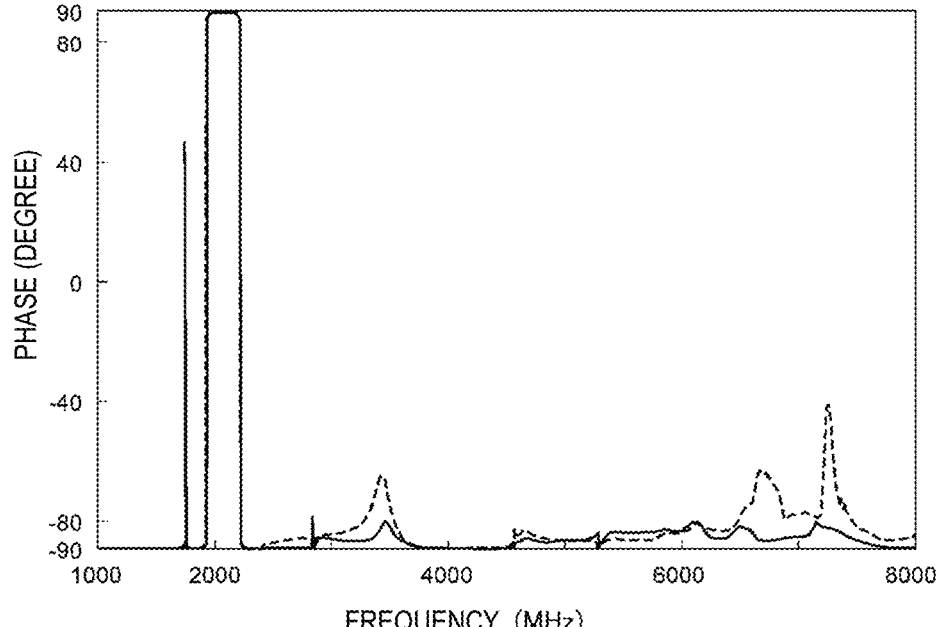
FIG. 9 is a graph indicating phase characteristics of elastic wave devices of a second example of a preferred embodiment of the present invention and a second comparative example defining and functioning as resonators.

FIG. 9 is a graph indicating phase characteristics of the elastic wave device of the second example and the elastic wave device of the second comparative examples serving as resonators. The solid line indicates the result of the second example, and the broken line indicates the result of the second comparative example.

As is apparent from FIG. 9, in the second comparative example, prominent higher-order mode spurious responses appear at around 3400 MHz, 6700 MHz, and 7200 MHz. In contrast, it can be understood that, in the second example, spurious responses at these frequency ranges are very small. As is apparent from FIG. 9, the magnitude of the main mode response at around 2000 MHz in the second example is comparable to the response obtained in the second comparative example. Thus, according to the elastic wave device of the second example of a preferred embodiment of the present invention, the main mode response is sufficiently large. Thus, it can be understood that, according to the second example also, higher-order mode spurious responses can be reduced or prevented without degrading the main mode response.

Next, in the structure of the second example, the total thickness of the first LiNbO₃ film and the second LiNbO₃ film was fixed at about 0.4 μm=0.2λ, and the thickness of the first LiNbO₃ film was changed to about 0.05 μm, about 0.1 μm, about 0.15 μm, about 0.2 μm, about 0.25 μm, about 0.3 μm, and about 0.35 μm. Y-cut LiNbO₃ films having various cut angles were used as the first and second LiNbO₃ films. The cut angles of the first LiNbO₃ film and the second LiNbO₃ film were equal or substantially equal to each other.

Figure 10:
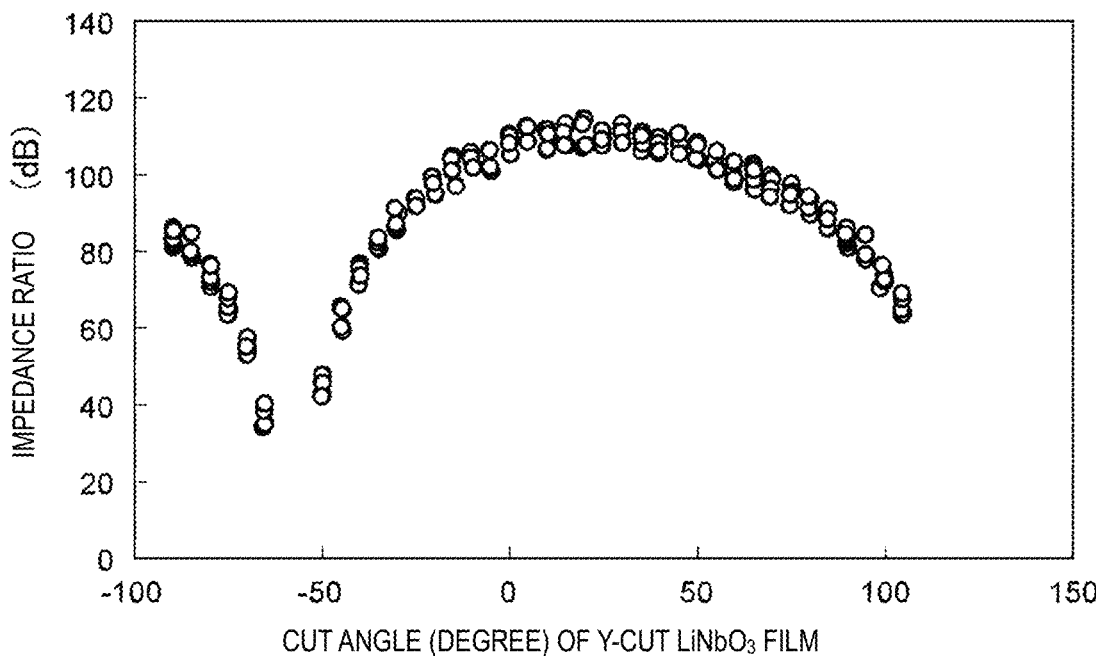
FIG. 10 is a graph indicating the relationship between impedance ratio in the impedance characteristics and the cut angle of the Y-cut $LiNbO_3$ film of an elastic wave device in which the total thickness of the first and second $LiNbO_3$ films formed of Y-cut $LiNbO_3$ films is fixed at about 0.4 μm=$0.2\lambda$ while the thickness of the first $LiNbO_3$ film is changed to about 0.05 μm, about 0.1 μm, about 0.15 μm, about 0.2 μm, about 0.25 μm, about 0.3 μm, and about 0.35 μm.

FIG. 10 is a graph indicating the relationship between the cut angle of the elastic wave devices configured as described above and the impedance ratio in the impedance character-istics. Here, the impedance ratio is a ratio of the impedance at an antiresonant frequency to the impedance at the reso-nant frequency of the main mode. FIG. 10 indicates that the main mode impedance ratio stays substantially the same for the respective cut angles even when the thickness of the first LiNbO₃ film is changed in the range of about 0.05 μm or more and about 0.35 μm or less. It can also be understood that as long as the cut angle is about −20° or more and about +90° or less, the main mode impedance ratio can be increased to about 80 dB or more. Thus, preferably, the cut angle of the Y-cut LiNbO₃ film is about −20° or more and about +90° or less, for example.

Figure 11:
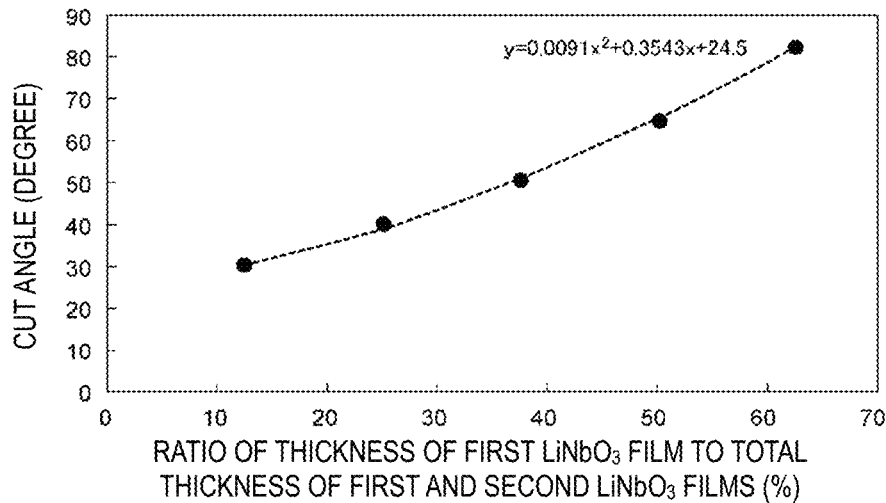
FIG. 11 is a graph indicating the relationship between the $LiNbO_3$ film cut angle that can effectively reduce or prevent the Rayleigh wave spurious response and the ratio of the thickness of the first $LiNbO_3$ film to the total thickness of the first and second $LiNbO_3$ films.

FIG. 11 is a graph indicating the relationship between the cut angle that can reduce or prevent Rayleigh wave spurious responses and the ratio (%) of the thickness of the first LiNbO₃ film to the total thickness of the first and second LiNbO₃ films in the second example, the ratio being changed while fixing the total thickness at about 0.4 m=0.2λ. The broken line in FIG. 11 indicates a formula obtained by approximation of multiple plots in FIG. 11. This formula is formula (2) below.

$$y=0.0091x^2+0.3543x+24.5 \qquad \text{formula (2)}$$

Here, y indicates the cut angle, and x indicates the aforementioned ratio of the thickness of the first LiNbO₃ film.

The Rayleigh wave spurious response can be further effectively reduced or prevented as long as the value relative to y obtained in approximation formula (2) is within the range of about (y±10°)+180n (where n represents an integer of 0, 1, 2, 3, . . . ) or in the range of (y±10°)−180n (where n represents an integer of 0, 1, 2, 3, . . . ).

Figure 12:
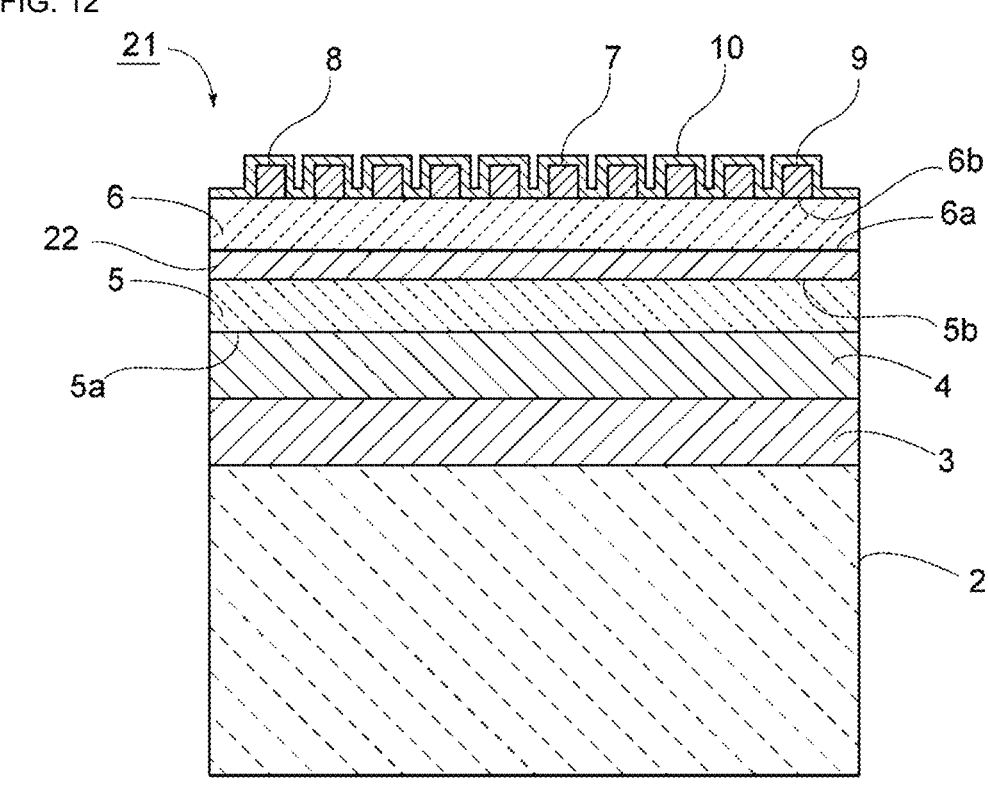
FIG. 12 is a front cross-sectional view of an elastic wave device according to a second preferred embodiment of the present invention.

FIG. 12 is a front cross-sectional view of an elastic wave device according to a second preferred embodiment of the present invention. In an elastic wave device 21, an insulating film 22 is interposed between a first piezoelectric film 5 and a second piezoelectric film 6. For example, an oxide film can be used as the insulating film 22. Other structures of the elastic wave device 21 are the same or substantially the same as those of the elastic wave device 1. As in the elastic wave device 21, an insulating film 22 may be interposed between the first piezoelectric film 5 and the second piezoelectric film 6.

Although the high acoustic velocity material layer 3 of the elastic wave device 1 is made of a silicon nitride film, for example, and the low acoustic velocity film 4 is made of a silicon oxide film, for example, the materials for these are not particularly limited. For example, various high acoustic velocity materials in which the acoustic velocity of the bulk wave propagating therein is higher than the acoustic velocity of the elastic wave propagating in the first and second piezoelectric films can be used as the high acoustic velocity material for the high acoustic velocity material layer 3. Examples of such a high acoustic velocity material include AlN, $Al_2O_3$, and diamond thin films.

In addition, the low acoustic velocity film 4 can be made of a low acoustic velocity material in which the acoustic velocity of the bulk wave propagating therein is lower than the acoustic velocity of the bulk wave propagating in the first and second piezoelectric films. Examples of such a low acoustic velocity material include silicon oxide and silicon oxynitride.

The materials of the IDT electrode 7 and the reflectors 8 and 9 are also not limited to a Ti/AlCu/Ti multilayer body, and various metals and alloys can be used. The IDT electrode 7 and the reflectors 8 and 9 may include a single-layer metal film, instead of the multilayer metal film.

The material for the dielectric film 10 is also not limited to silicon oxide, and various dielectrics such as, for example, silicon oxynitride can be used.

Although the high acoustic velocity material layer 3 of the elastic wave device 1 is disposed on the support substrate 2, the high acoustic velocity material layer 3 can be integrated with the support substrate 2 by using a high acoustic velocity material.

Moreover, the high acoustic velocity material layer 3 can be directly provided on the first piezoelectric film without providing the low acoustic velocity film 4. Thus, when the support substrate is made of a high acoustic velocity material layer, the first piezoelectric film may be directly disposed on the support substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a support substrate;
a piezoelectric film directly or indirectly provided on the support substrate; and
an IDT electrode on the piezoelectric film; wherein
the piezoelectric film includes a first piezoelectric film in which a surface facing the support substrate is a minus surface and a surface facing the IDT electrode is a plus surface, and a second piezoelectric film in which a surface facing the support substrate is a plus surface and a surface facing the IDT electrode is a minus surface, the second piezoelectric film being located on the first piezoelectric film; and
a total of a thickness of the first piezoelectric film and a thickness of the second piezoelectric film is about 1λ or less, where λ represents a wavelength determined by an electrode finger pitch of the IDT electrode.

2. The elastic wave device according to claim 1, wherein the total of the thickness of the first piezoelectric film and the second piezoelectric film is about 0.5λ or less.

3. The elastic wave device according to claim 1, wherein the total of the thickness of the first piezoelectric film and the second piezoelectric film is about 0.25λ or less.

4. The elastic wave device according to claim 1, wherein the first piezoelectric film or the second piezoelectric film closer to the support substrate has a thickness larger than a thickness of another one of the first piezoelectric film or the second piezoelectric film farther from the support substrate.

5. The elastic wave device according to claim 1, wherein the first piezoelectric film and the second piezoelectric film are stacked such that the plus surface of the first piezoelectric film is in contact with the plus surface of the second piezoelectric film.

6. The elastic wave device according to claim 1, wherein the first piezoelectric film and the second piezoelectric film are each a $LiTaO_3$ film.

7. The elastic wave device according to claim 6, wherein the first piezoelectric film and the second piezoelectric film are each a Y-cut $LiTaO_3$ film with a cut angle of the first piezoelectric film or the second piezoelectric film being −20° or more and 75° or less.

8. The elastic wave device according to claim 6, wherein a cut angle of each of the first piezoelectric film and the second piezoelectric film is a value within a range of about (y±10°)+180n (where n represents an integer of 0, 1, 2, 3 . . . ) or a range of about (y±10°)−180n (where n represents an integer of 0, 1, 2, 3 . . . ), and y satisfies formula (1) below where x (%) represents a ratio of a thickness of one piezoelectric film selected from the first piezoelectric film and the second piezoelectric film to the total thickness of the first piezoelectric film and the second piezoelectric film, the one selected piezoelectric film being adjacent to or in a vicinity of the support substrate:

$$y = -0.0009955556x^3 + 0.1552380952x^2 - 4.6325396825x + 78.5714285714 \qquad \text{formula (1)}.$$

9. The elastic wave device according to claim 1, wherein the first and second piezoelectric films are each a $LiNbO_3$ film.

10. The elastic wave device according to claim 9, wherein the first and second piezoelectric films are each a Y-cut $LiNbO_3$ film with a cut angle of about −20° or more and about +90° or less.

11. The elastic wave device according to claim 9, wherein a cut angle of each of the first piezoelectric film and the second piezoelectric film is a value within a range of about (y±10°)+180n (where n represents an integer of 0, 1, 2, 3 . . . ) or a range of about (y±10°)−180n (where n represents an integer of 0, 1, 2, 3 . . . ), and y satisfies formula (2) below where x (%) represents a ratio of a thickness of one piezoelectric film selected from the first piezoelectric film and the second piezoelectric film to the total thickness of the first piezoelectric film and the second piezoelectric film, the one selected piezoelectric film being adjacent to or in a vicinity of the support substrate:

$$y = 0.0091x^2 + 0.3543x + 24.5 \qquad \text{formula (2)}.$$

12. The elastic wave device according to claim 1, further comprising an insulating film interposed between the first piezoelectric film and the second piezoelectric film.

13. The elastic wave device according to claim 1, further comprising a high acoustic velocity material layer interposed between the support substrate and the piezoelectric film, and made of a high acoustic velocity material in which an acoustic velocity of a bulk wave propagating therein is higher than an acoustic velocity of an elastic wave propagating in the first piezoelectric film and the second piezoelectric film.

14. The elastic wave device according to claim 13, wherein the support substrate is made of the high acoustic velocity material, and the high acoustic velocity material layer and the support substrate are integrated.

15. The elastic wave device according to claim 13, further comprising a low acoustic velocity film interposed between the high acoustic velocity material layer and the piezoelectric film and made of a low acoustic velocity material in which an acoustic velocity of a bulk wave propagating therein is lower than an acoustic velocity of a bulk wave propagating in the first piezoelectric film and the second piezoelectric film.

16. The elastic wave device according to claim 1, further comprising a dielectric film covering the IDT electrode.

17. The elastic wave device according to claim 1, wherein the IDT electrode includes a main electrode layer made of Al or an AlCu alloy.

18. The elastic wave device according to claim 1, wherein the support substrate is made of Si having a (111) surface, Si having a (110) surface, or quartz crystal.

19. The elastic wave device according to claim 1, wherein the first piezoelectric film and the second piezoelectric film are each made of lithium tantalate or lithium niobate.

20. An elastic wave device comprising:

a support substrate;

a piezoelectric film directly or indirectly provided on the support substrate; and an IDT electrode on the piezoelectric film; wherein the piezoelectric film includes a first piezoelectric film in which a surface facing the support substrate is a plus surface and a surface facing the IDT electrode is a minus surface, and a second piezoelectric film in which a surface facing the support substrate is a minus surface and a surface facing the IDT electrode is a plus surface, the second piezoelectric film being located on the first piezoelectric film; and a total of a thickness of the first piezoelectric film and a thickness of the second piezoelectric film is about 1λ or less, where λ represents a wavelength determined by an electrode finger pitch of the IDT electrode.

* * * * *